United States Patent
Yu et al.

(10) Patent No.: US 10,866,373 B2
(45) Date of Patent: Dec. 15, 2020

(54) OPTICAL TRANSCEIVER AND MANUFACTURING METHOD THEREOF

(71) Applicant: Taiwan Semiconductor Manufacturing Company, Ltd., Hsinchu (TW)

(72) Inventors: Chen-Hua Yu, Hsinchu (TW); Hsing-Kuo Hsia, Jhubei (TW); Sung-Hui Huang, Dongshan Township (TW); Kuan-Yu Huang, Taipei (TW); Kuo-Chiang Ting, Hsinchu (TW); Shang-Yun Hou, Jubei (TW); Chi-Hsi Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/451,472

(22) Filed: Jun. 25, 2019

(65) Prior Publication Data
US 2020/0003975 A1  Jan. 2, 2020

Related U.S. Application Data

(60) Provisional application No. 62/864,608, filed on Jun. 21, 2019, provisional application No. 62/690,658, filed on Jun. 27, 2018.

(51) Int. Cl.
*G02B 6/42* (2006.01)
*H01L 23/00* (2006.01)
*H01L 23/48* (2006.01)

(52) U.S. Cl.
CPC ......... *G02B 6/4255* (2013.01); *G02B 6/4243* (2013.01); *G02B 6/4246* (2013.01);
(Continued)

(58) Field of Classification Search
None
See application file for complete search history.

(56) References Cited

U.S. PATENT DOCUMENTS

2002/0003232 A1* 1/2002 Ahn .................. G02B 6/4201 257/81
2010/0171023 A1* 7/2010 Asahi .................. G02B 6/4201 250/205

(Continued)

FOREIGN PATENT DOCUMENTS

CN 106094125 A 11/2016
KR 20170054254 A 5/2017

(Continued)

*Primary Examiner* — Michael Stahl
(74) *Attorney, Agent, or Firm* — Slater Matsil, LLP

(57) ABSTRACT

A structure including a photonic integrated circuit die, an electric integrated circuit die, a semiconductor dam, and an insulating encapsulant is provided. The photonic integrated circuit die includes an optical input/output portion and a groove located in proximity of the optical input/output portion, wherein the groove is adapted for lateral insertion of at least one optical fiber. The electric integrated circuit die is disposed over and electrically connected to the photonic integrated circuit die. The semiconductor dam is disposed over the photonic integrated circuit die. The insulating encapsulant is disposed over the photonic integrated circuit die and laterally encapsulates the electric integrated circuit die and the semiconductor dam.

20 Claims, 21 Drawing Sheets

(52) U.S. Cl.
 CPC .............. *H01L 24/16* (2013.01); *H01L 24/81* (2013.01); *H01L 23/481* (2013.01); *H01L 2224/16148* (2013.01); *H01L 2224/81815* (2013.01)

(56) References Cited

U.S. PATENT DOCUMENTS

| | | | |
|---|---|---|---|
| 2012/0241795 A1* | 9/2012 | Chang | G02B 6/4201 |
| | | | 257/98 |
| 2017/0115458 A1 | 4/2017 | Mekis et al. | |
| 2017/0254968 A1* | 9/2017 | Ding | G02B 6/428 |
| 2018/0138101 A1 | 5/2018 | Yu et al. | |
| 2018/0138151 A1 | 5/2018 | Shih et al. | |
| 2019/0285804 A1* | 9/2019 | Ramachandran | G02B 6/30 |
| 2019/0333905 A1* | 10/2019 | Raghunathan | H01L 25/18 |

FOREIGN PATENT DOCUMENTS

| | | |
|---|---|---|
| KR | 20180054110 A | 5/2018 |
| TW | 201818514 A | 5/2018 |

\* cited by examiner

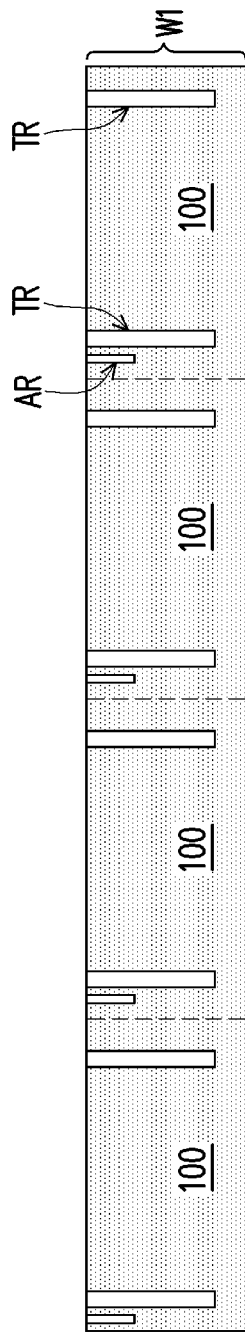
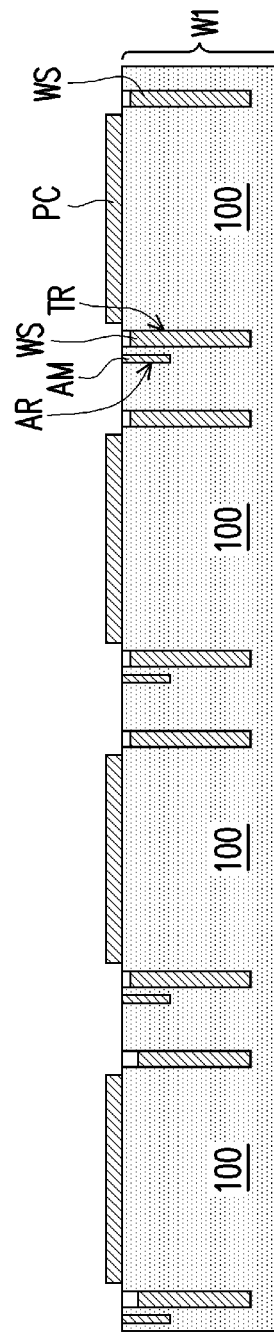
FIG. 1A
FIG. 1B

OPTICAL TRANSCEIVER AND MANUFACTURING METHOD THEREOF

PRIORITY CLAIM

This application claims the benefit of and priority to U.S. Provisional Patent Application No. 62/690,658, filed on Jun. 27, 2018, entitled "Optical Fibers Attached to Interposers," and U.S. Provisional Patent Application No. 62/864,608, filed on Jun. 21, 2019, entitled "Optical Transceiver and Manufacturing Method Thereof," which applications are incorporated herein by reference in their entirety.

BACKGROUND

Optical transceiver modules are used in high-speed optical communication systems that require high performance, compact package, and low power consumption. Optical transmission/reception functions are implemented in pluggable optical transceiver modules. The optical transceiver modules comply with various international standard specifications at communication speeds ranging up to more than 100 Gbps. Currently, fabrication processes of the compact optical transceiver modules are quite complex and increase of the yield rate thereof is needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A through 1C schematically illustrate a process flow for fabricating dummy dies in accordance with some embodiments of the present disclosure.

DETAILED DESCRIPTION

Figure 1C:
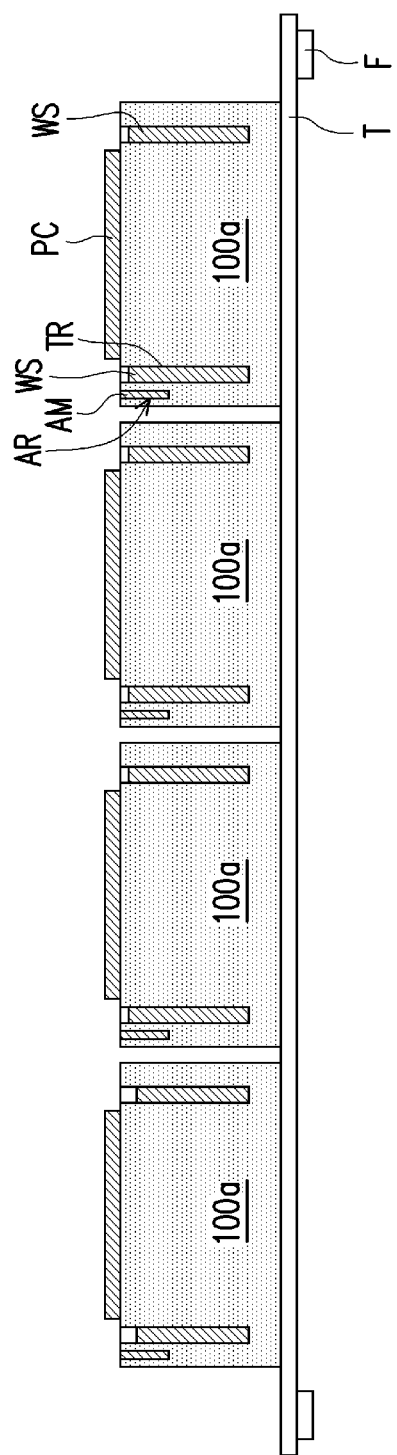

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
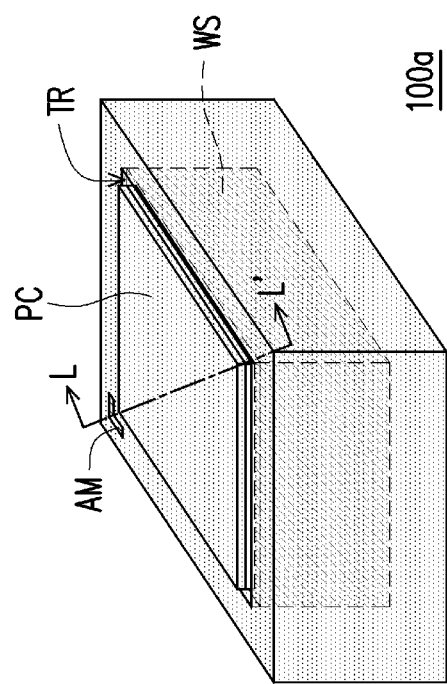
FIG. 2 schematically illustrates a perspective view of a singulated dummy die in accordance with some embodiments of the present disclosure.

FIGS. 1A through 1C schematically illustrate a process flow for fabricating dummy dies in accordance with some embodiments of the present disclosure. FIG. 2 schematically illustrates a perspective view of a singulated dummy die in accordance with some embodiments of the present disclosure. FIGS. 3A through 3K schematically illustrate a process flow for fabricating CoWoS packages in accordance with some embodiments of the present disclosure. FIG. 4 schematically illustrates a perspective view of the interposer illustrated in FIG. 3A and the singulated dummy die illustrated in FIG. 2 in accordance with some embodiments of the present disclosure.

Referring to FIG. 1A, a dummy semiconductor wafer W1 including a plurality of dummy dies 100 is provided. The dummy dies 100 in the dummy semiconductor wafer W1 are arranged in array and physically connected to one another. The dummy semiconductor wafer W1 may be a silicon dummy wafer. In some embodiments, the dummy semiconductor wafer W1 may include a plurality of trenches TR (e.g., ring-shaped trenches) formed therein, the trenches TR are arranged in array, and each of the dummy dies 100 may respectively include at least one of the trenches TR. The trenches TR extend downwardly from a top surface of the dummy semiconductor wafer W1 into the interior of the dummy semiconductor wafer W1. In some alternative embodiments, the dummy semiconductor wafer W1 may include a plurality of trenches TR (e.g., ring-shaped trenches) and a plurality of alignment recesses AR (e.g., L-shaped alignment recesses or cross-shaped alignment recesses) formed therein, wherein the trenches TR are arranged in array, the alignment recesses AR are arranged corresponding to the trenches TR, and each of the dummy dies 100 may include at least one of the trenches TR and at least one of the alignment recesses AR respectively. The trenches TR and the alignment recesses AR extend downwardly from the top surface of the dummy semiconductor wafer W1 into the interior of the dummy semiconductor wafer W1. For example, each of the alignment recesses AR is located around a corner of one of the trenches TR, respectively.

As shown in FIG. 1A, in some embodiments, the trenches TR have greater depth than the alignment recesses AR. For example, the depth of the trenches TR may range from about 50 micrometers to about 600 micrometers, which is about 7% to about 80% of the thickness of the dummy semiconductor wafer W1, and the depth of the alignment recesses AR may range from about 30 micrometers to about 300 micrometers, which is be about 4% to about 40% of the thickness of the dummy semiconductor wafer W1. The trenches TR and the alignment recesses AR may be formed by etching or other suitable processes.

Referring to FIG. 1B, after providing the dummy semiconductor wafer W1, a printing process is performed on the dummy semiconductor wafer W1 to form a plurality of wall structures WS in the trenches TR, a plurality of alignment marks AM in the alignment recesses AR, and a plurality of protection coatings PC partially covering the top surface of the dummy semiconductor wafer W1. The wall structures WS and the alignment marks AM are embedded in the dummy semiconductor wafer W1 while the wall structures WS and the alignment marks AM are not covered by the protection coatings PC. In some embodiments, the wall structures WS may be ring-shaped wall structures, and the alignment marks AM may be L-shaped alignment marks or cross-shaped alignment marks. The wall structures WS, the alignment marks AM, and the protection coatings PC are, for example, formed by three-dimensional (3D) printing process such that the wall structures WS, the alignment marks AM, and the protection coatings PC may be different in thickness and volume. The material of the wall structures WS, the alignment marks AM, and the protection coatings PC may include polymer (e.g., polyimide or the like). The wall structures WS may partially fill the trenches TR to allow for a placement of protrusions P (not illustrated in FIG. 1B but illustrated and described below with respect to FIG. 3A) at least partially into the trenches TR, the alignment marks AM may fully fill the alignment recesses AR, and the protection coatings PC may cover portions of the top surface of the dummy semiconductor wafer W1 which are enclosed by the ring-shaped wall structures WS. Since the wall structures WS partially fill the trenches TR and do not protrude from the top surface of the dummy semiconductor wafer W1, the wall structures WS are not in contact with the protection coatings PC directly. For example, the height of the wall structures WS may range from about 50 micrometers to about 600 micrometers, which is about 7% to about 80% of the thickness of the dummy semiconductor wafer W1. In some embodiments, top surfaces of the wall structures WS are lower than the top surfaces of the singulated dummy dies 100a and the level height difference between the surfaces of the wall structures WS are lower than the top surfaces of the singulated dummy dies 100a ranges from about 3 micrometers to about 50 micrometers.

The cross-sectional view of the singulated dummy die 100a illustrated in FIG. 1C is cut along the cross-sectional line L-L' shown in FIG. 2. Referring to FIG. 1C, the dummy semiconductor wafer W1 is attached onto a saw tape T carried by a frame F. A singulation process (e.g. a wafer sawing process) is then performed to singulate the dummy semiconductor wafer W1 to obtain a plurality of singulated dummy dies 100a.

As shown in FIG. 1C and FIG. 2, the singulated dummy die 100a includes a trench TR, a wall structure WS partially filled in the trench TR, an alignment mark AM, and a protection coating PC. The trench TR and the wall structure WS define a central region and a periphery region of the singulated dummy die 100a, wherein a region surrounded by the wall structure WS may be referred as to the central region, and a region outside the wall structure WS may be referred as to the periphery region. The wall structure WS and the alignment mark AM are embedded in the singulated dummy die 100a. The wall structure WS and the alignment mark AM both extend downwardly from the top surface of the singulated dummy die 100a into the interior of the singulated dummy die 100a. The protection coating PC partially covers the top surface of the central region of the singulated dummy die 100a. The wall structure WS and the alignment mark AM are not covered by the protection coatings PC. The protection coating PC may cover a portion of the top surface of the singulated dummy die 100a which is enclosed by the ring-shaped wall structure WS. Since the wall structure WS partially fills the trench TR and does not protrude from the top surface of the singulated dummy die 100a, the wall structure WS embedded in the singulated dummy die 100a is not in contact with the protection coating PC directly. For example, the height of the wall structure WS may range from about 50 micrometers to about 600 micrometers, which is about 7% to about 80% of the thickness of the singulated dummy die 100a. In some alternative embodiments, the singulated dummy die 100a may not include the alignment mark AM.

Figure 3A:
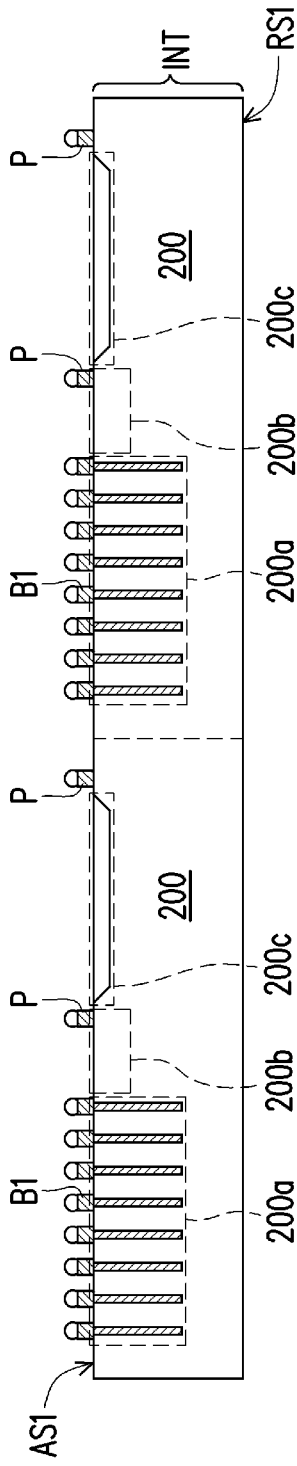
FIGS. 3A through 3K schematically illustrate a process flow for fabricating Chip-on-Wafer-on-Substrate (CoWoS) packages in accordance with some embodiments of the present disclosure.

Referring to FIG. 3A, an interposer wafer INT including a plurality of photonic integrated circuit dies 200 is provided. The photonic integrated circuit dies 200 in the interposer wafer INT are arranged in array and physically connected to one another. Each of the photonic integrated circuit dies 200 may respectively include an electrical bonding portion 200a, at least one optical input/output portion 200b configured to transmit and receive optical signal, and at least one groove 200c located in the proximity of the at least one optical input/output portion 200b. The above-mentioned optical signal is, for example, pulsed light, light with continuous wave (CW) combinations thereof, or the like. In some embodiments, the electrical bonding portions 200a of the photonic integrated circuit dies 200 may include structures to form through semiconductor vias (TSVs—described further below with respect to FIG. 3G), semiconductor devices (e.g., transistors, capacitors and so on), wirings, or other conductors for electrical connection while the optical input/output portions 200b of the photonic integrated circuit dies 200 may include semiconductor devices and optical devices for processing the optical signal. For example, the semiconductor devices formed in the optical input/output portions 200b may include transistors, capacitors, photodiodes or the combination thereof, and the optical devices formed in the optical input/output portions 200b may include edge couplers, modulators, waveguides, filters, or the combination thereof. As shown in FIG. 3A, the interposer wafer INT may include a first active surface AS1 and a first rear surface RS1 opposite to the first active surface AS1, where the electrical bonding portions 200a, the optical input/output portions 200b and the grooves 200c of the photonic integrated circuit dies 200 are formed at the first active surface AS1 of the interposer wafer INT. In some embodiments, the grooves 200c formed on the first active surface AS1 of the interposer wafer INT may be V-grooves (shown in FIG. 4) formed by etching (e.g., stacking a dielectric layer and a passivation layer over the wafer INT, forming an opening, lining the openings with a dielectric such as silicon nitride, opening the lining, and wet etching the wafer INT through the lining before removing the layers) or other suitable processes. The number of the groove(s) 200c formed on each photonic integrated circuit die 200 is not limited in this disclosure.

As shown in FIG. 3A, the interposer wafer INT may further include a plurality of conductive bumps B1 formed on the first active surface AS1 thereof. In some embodiments, the conductive bumps B1 may be micro-bumps (e.g., solder bumps, copper bumps or other metallic bumps) formed on the first active surface AS1 of the interposer wafer INT. For example, a plurality of groups of conductive bumps B1 may be formed on the interposer wafer INT, and each group of conductive bumps B1 may be formed on one of the photonic integrated circuit dies 200 respectively. Furthermore, the interposer wafer INT may further include a plurality of protrusions P formed on the first active surface AS1 thereof. In some embodiments the protrusions P are formed of the same materials and processes as the conductive bumps, although they may also be different. The protrusions P may be ring-shaped protrusions which surround the grooves 200c. The dimension (i.e. thickness and width), position, and shape of the protrusions P may be designed to correspond to the trenches TR of the singulated dummy dies 100a as illustrated in FIG. 2. For example, the height of the protrusions P ranges from about 5 micrometers to about 50 micrometers.

Figure 3B:
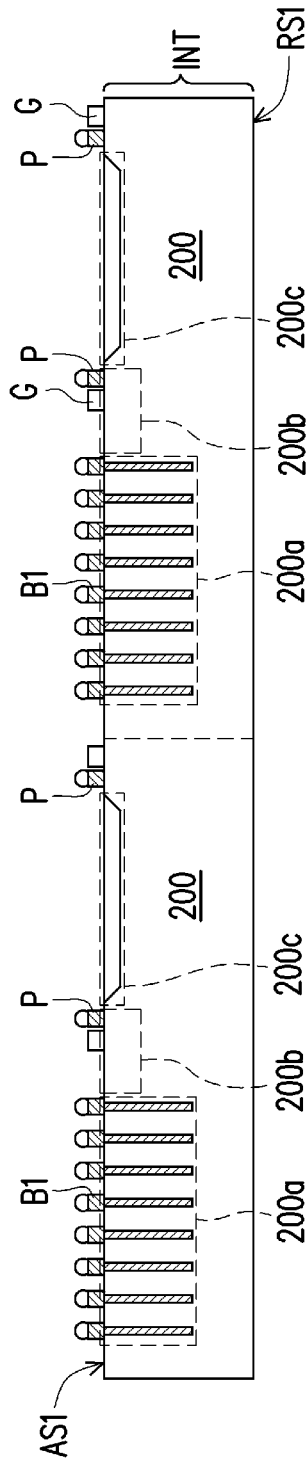
Figure 3C:
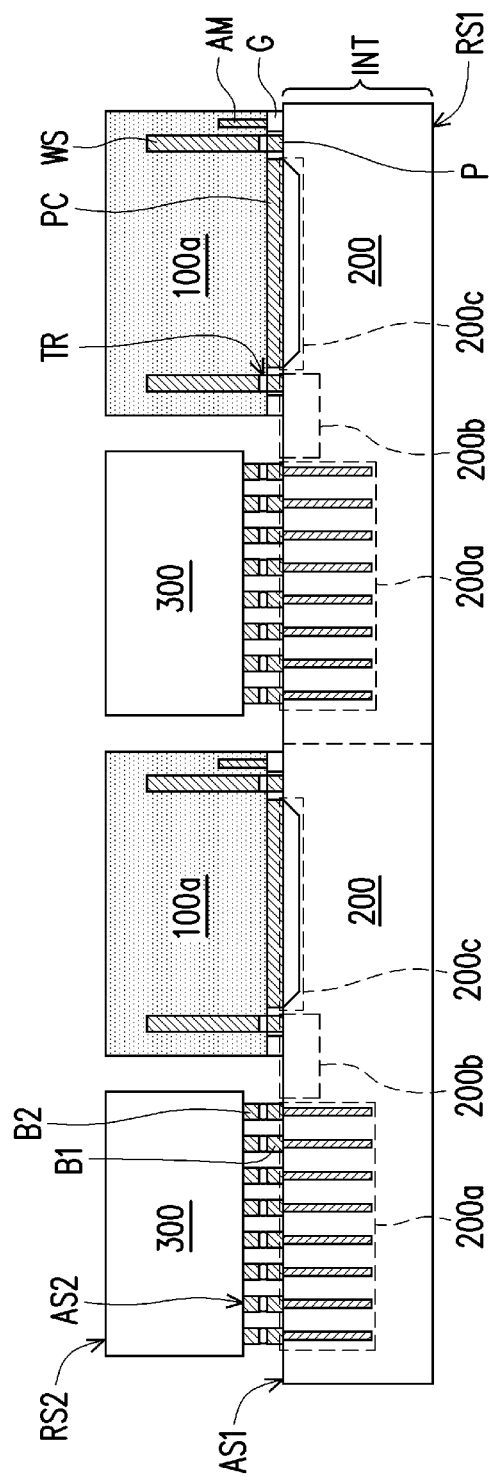

Referring to FIG. 3B, FIG. 3C, and FIG. 4, a plurality of glue layers G are formed on the first active surface AS1 of the interposer wafer INT. Then, the singulated dummy dies 100a are picked-up and placed on the first active surface AS1 of the interposer wafer INT. The singulated dummy dies 100a are attached onto the first active surface AS1 of the interposer wafer INT through the glue layers G. The glue layers G may be a thermally curable polymer formed on the first active surface AS1 of the interposer wafer INT through a dispensing process or the like. The glue layer G may serve as an adhesive for adhering the singulated dummy dies 100a with the first active surface AS1 of the interposer wafer INT. The glue layer G may keep a lateral distance from the protrusions P. In some alternative embodiments, the glue layer G may be adhered with the protrusions P. The thickness of the glue layers G may be less than the height of the protrusions P, as illustrated in FIG. 3B. Furthermore, the distribution of the glue layers G may correspond to the periphery regions of the singulated dummy dies 100a such that the groove 200c formed on the first active surface AS1 of the interposer wafer INT is not covered by the glue layer G.

After attaching the singulated dummy dies 100a onto the interposer wafer INT, the periphery regions of the singulated dummy dies 100a adhere with the interposer wafer INT through the glue layers G, and the central region of the singulated dummy dies 100a cover the grooves 200c. The protrusions P may extend toward the wall structures WS and protrude into the trenches TR of the singulated dummy dies 100a. In some embodiments, the protrusions P are directly in contact with the wall structures WS of the singulated dummy dies 100a, and the trenches TR of the singulated dummy dies 100a are fully or partially filled by the protrusions P and the wall structures WS. In some alternative embodiments, the protrusions P are not in contact with the wall structures WS of the singulated dummy dies 100a. The protrusions P and the trenches TR may facilitate the alignment of the singulated dummy dies 100a and the interposer wafer INT.

After attaching the singulated dummy dies 100a onto the interposer wafer INT, the protection coatings PC of the singulated dummy dies 100a may cover and protect the grooves 200c of the interposer wafer INT from being damaged. As illustrated in FIG. 3C, in some embodiments, the protection coatings PC may keep a lateral distance from the protrusions P, to help keep the protection coatings PC from interfering with the protrusions P. For example, the lateral distance from the protection coatings PC to the protrusions P ranges from about 10 micrometers to about 100 micrometers. In some alternative embodiments, the protection coatings PC may be in contact with the protrusions P. The thickness of the protection coatings PC may be substantially identical to that of the glue layers G. For example, the thickness of the protection coatings PC and the glue layers G ranges from about 100 micrometers to about 2000 micrometers. Furthermore, the protection coatings PC may be in contact with the first active surface AS1 of the interposer wafer INT but not permanently adhered with the first active surface AS1 of the interposer wafer INT.

Referring to FIG. 3C, a plurality of electric integrated circuit dies 300 including conductive bumps B2 formed thereon are provided and mounted onto the interposer wafer INT. In some embodiments, the electric integrated circuit dies 300 may be picked-up and placed onto the first active surface AS1 of the interposer wafer INT such that the electric integrated circuit dies 300 may cover the electrical bonding portions 200a of photonic integrated circuit dies 200. Each one of the electric integrated circuit dies 300 may respectively include a second active surface AS2 and a second rear surface RS2 opposite to the second active surface AS2. After the electric integrated circuit dies 300 are picked-up and placed onto the interposer wafer INT, the second active surface AS2 of the electric integrated circuit dies 300 may face the interposer wafer INT and the electric integrated circuit dies 300 may be bonded with the interposer wafer INT through the conductive bumps B1, the conductive bumps B2, and solder material between the conductive bumps B1 and B2. For example, a reflow process of the conductive bumps B1 may be performed to facilitate the bonding between the electric integrated circuit dies 300 and the interposer wafer INT. In some embodiments, the number of the electric integrated circuit dies 300 may be equal to the number of photonic integrated circuit dies 200 included in the interposer wafer INT. In some alternative embodiments, the number of the electric integrated circuit dies 300 may be greater than the number of photonic integrated circuit dies 200 included in the interposer wafer INT. The number of the electric integrated circuit dies 300 is not limited in this disclosure.

In some embodiments, the attachment of the singulated dummy dies 100a is performed prior to the bonding of the electric integrated circuit dies 300. In some alternative embodiments, the bonding of the electric integrated circuit dies 300 is performed prior to the attachment of the singulated dummy dies 100a.

Figure 3D:
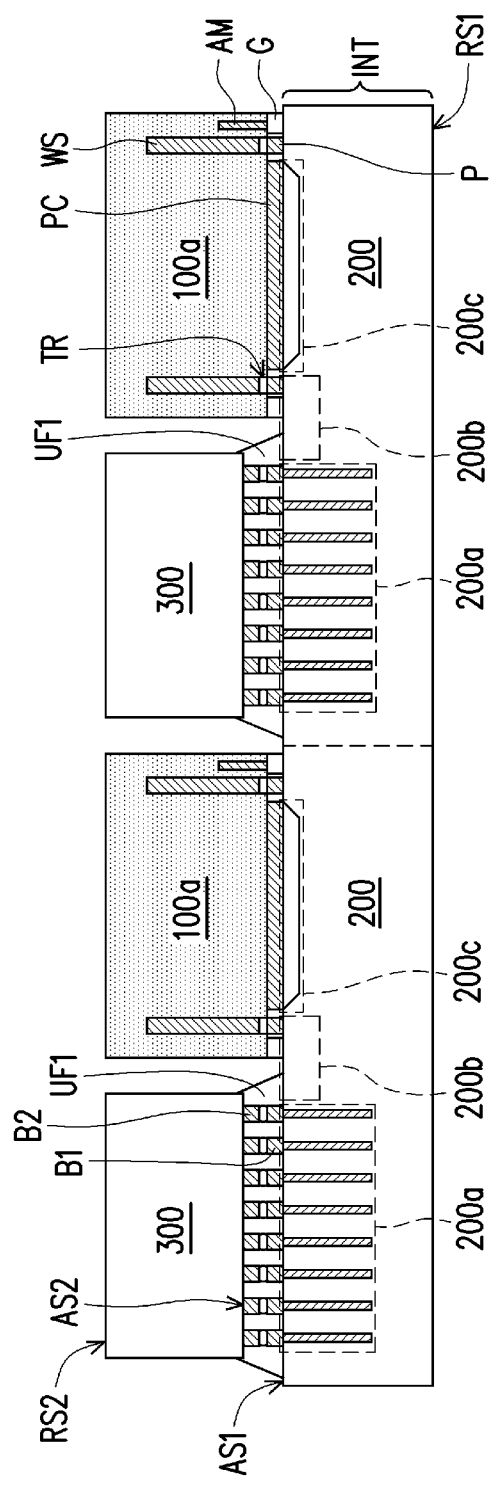

Referring to FIG. 3D, after performing the above-mentioned reflow process of the conductive bumps B1 and B2, underfills UF1 may be formed between the electric integrated circuit dies 300 and the interposer wafer INT so as to laterally encapsulate the conductive bumps B1 and B2. The underfills UF1 not only protects the conductive bumps B1 and B2 from fatigue but also enhances bonding reliability between the electric integrated circuit dies 300 and the interposer wafer INT. In some embodiments, the material of the glue layer G and the underfills UF1 may be a thermally curable polymer and may be cured simultaneously by thermal curing process.

In some other embodiments, the formation of the underfill UF1 may be omitted.

Although the bonding and electrical connection (shown in FIG. 3C) between the electric integrated circuit dies 300 and the interposer wafer INT is achieved by the conductive bumps B1 and B2 encapsulated by the underfill UF1, the bonding and electrical connection between the electric integrated circuit dies 300 and the interposer wafer INT of this disclosure is not limited thereto. Other suitable chip-to-wafer bonding processes (e.g., a chip-to-wafer hybrid bonding process) may be utilized.

Figure 3E:
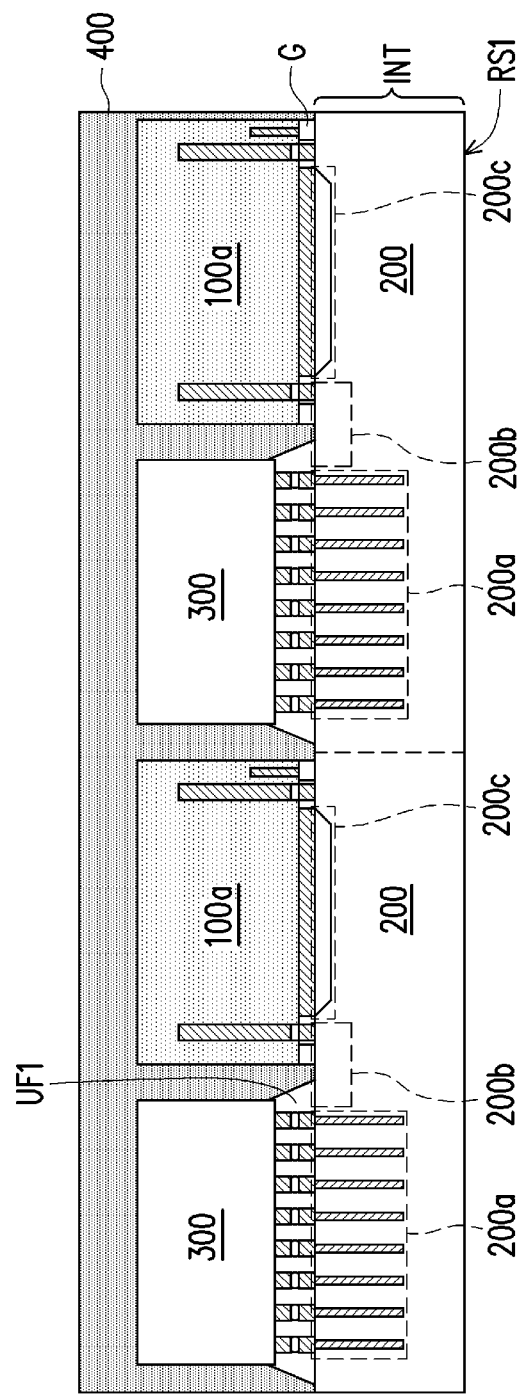
Figure 3F:
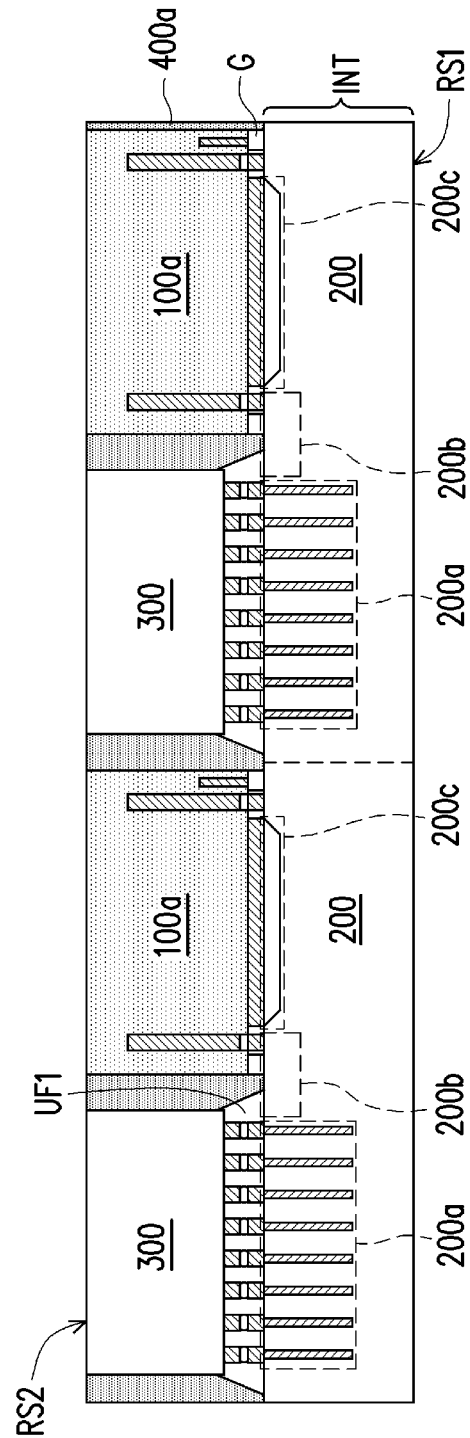

Referring to FIG. 3E and FIG. 3F, an insulating encapsulant 400 is formed on the interposer wafer INT to encapsulate the singulated dummy dies 100a, the electric integrated circuit dies 300, the underfill UF1, and the glue layers G. In some embodiments, the insulating encapsulant 400 may be formed by an over-mold process followed by a first grinding process. During the over-mold process, an insulating molding material is formed on the interposer wafer INT to encapsulate the electric integrated circuit dies 300, the underfill UF1 and the glue layers G such that the electric integrated circuit dies 300, the underfill UF1 and the glue layers G are not revealed. Then, as illustrated in FIG. 3F, the insulating molding material is ground or polished until the second rear surface RS2 of the electric integrated circuit dies 300 and the rear surface of the dummy dies 100a are exposed. After performing the first grinding process, a polished insulating encapsulant 400a laterally encapsulating the dummy dies 100a and the electric integrated circuit dies 300 is formed over the interposer wafer INT. The above-mentioned first grinding process of the insulating mold material may be a chemical mechanical polishing (CMP) process, a mechanical grinding process, combinations thereof or other suitable processes.

Figure 3G:
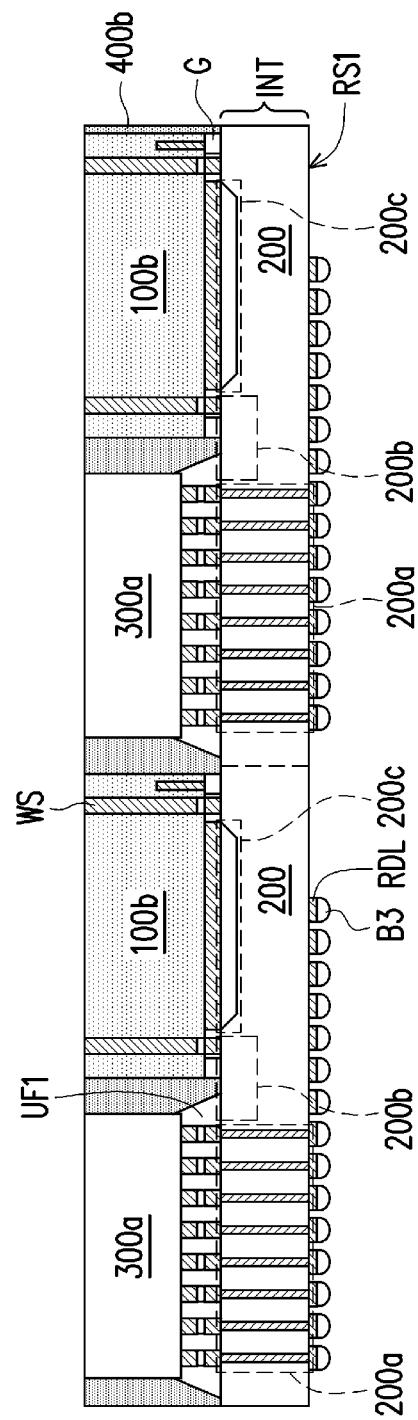
Figure 4:
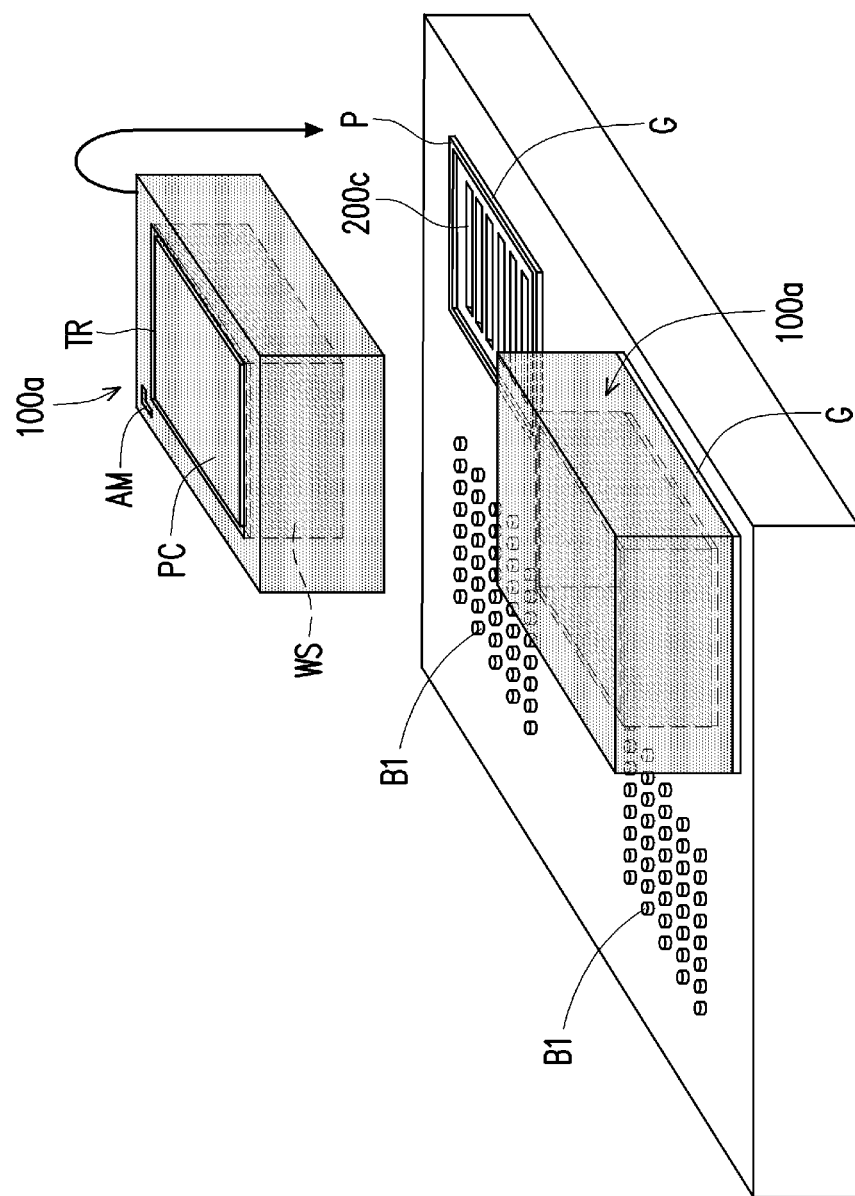
FIG. 4 schematically illustrates a perspective view of the interposer illustrated in FIG. 3A and the singulated dummy die illustrated in FIG. 2 in accordance with some embodiments of the present disclosure.

Referring to FIG. 3G, a thinning process is performed to reduce the thickness of the interposer wafer INT from the first rear surface RS1. In some embodiments, a grinding or polishing process may be performed on the first rear surface RS1 of the interposer wafer INT until the electrical bonding portions 200a of the photonic integrated circuit dies 200 are revealed from the first rear surface RS1 of the interposer wafer INT, i.e., to complete formation of TSVs. The above-mentioned thinning process of the interposer wafer INT may be a chemical mechanical polishing (CMP) process, a mechanical grinding process, combinations thereof or other suitable processes.

After performing the thinning process of the interposer wafer INT, redistribution wirings RDL and conductive bumps B3 may be formed on the first rear surface RS1 of the interposer wafer INT. In some embodiments, the conductive bumps B3 formed on the first rear surface RS1 of the interposer wafer INT may be controlled collapse chip connection bumps (C4 bumps). For example, a plurality of groups of conductive bumps B3 may be formed on the first rear surface RS1 of the interposer wafer INT, and each group of conductive bumps B3 may be formed on one of the photonic integrated circuit dies 200 respectively.

After performing the thinning process of the interposer wafer INT, the insulating molding material is further ground or polished by a second grinding process. During the second grinding process of the insulating encapsulant 400a, not only the insulating molding material is partially removed but also portions of the electric integrated circuit dies 300 and the singulated dummy dies 100a are removed. After performing the second grinding process, dummy dies 100b with reduced thickness, electric integrated circuit dies 300a with reduced thickness, and a polished insulating encapsulant 400b are formed over the interposer wafer INT. As shown in FIG. 3G, after performing the second grinding process, the wall structures WS are revealed from the rear surface of the dummy dies 100b. The above-mentioned second grinding process of the insulating mold material may be a chemical mechanical polishing (CMP) process, a mechanical grinding process, combinations thereof or other suitable processes.

Figure 3H:
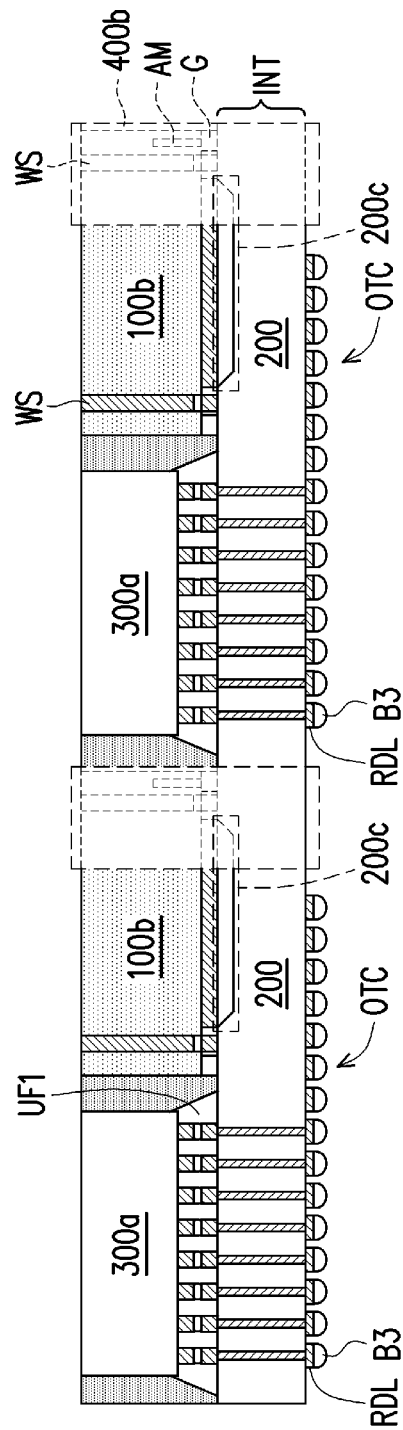

Referring to FIG. 3H, a singulation process is performed to singulate the wafer level structure illustrated in FIG. 3G into a plurality of singulated optical transceivers OTC. Portions of the insulating encapsulant 400b, portions of the dummy dies 100b, and portions of the glue layers G may be removed by the singulation process. As illustrated in FIG. 3H, the alignment marks AM, portions of the wall structures WS, portions of the central regions of the dummy dies 100b, and portions of the periphery regions of the dummy dies 100b may be removed by the singulation process. After performing the singulation process, an end of the groove 200c are accessibly exposed from a sidewall of the singulated optical transceiver OTC.

Figure 3I:
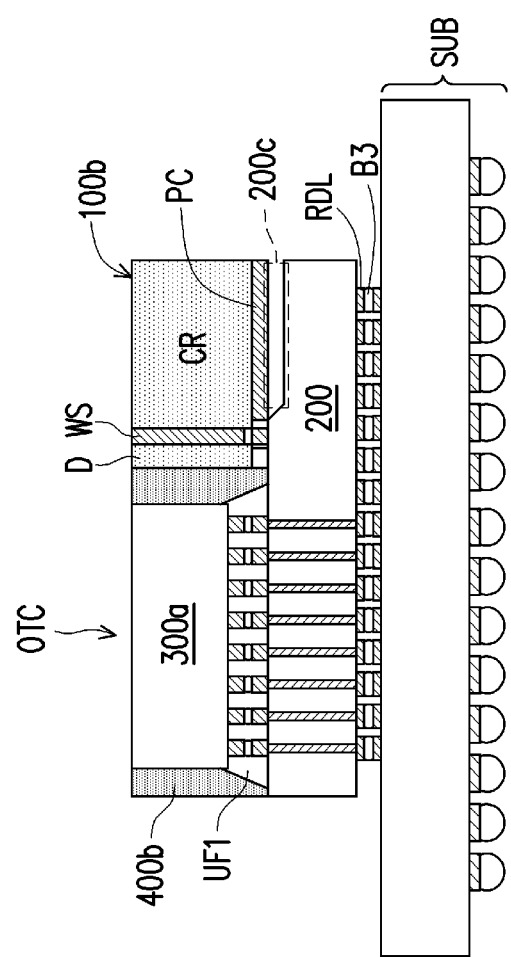

Referring to FIG. 3I, after performing the singulation process, one of the singulated optical transceivers OTC is picked-up and placed on a circuit substrate SUB. The conductive bumps B3 of the singulated optical transceiver OTC are electrically connected to wirings of the circuit substrate SUB. In some embodiments, the circuit substrate SUB is a printed circuit board including a plurality of conductive balls (e.g., solder balls or the like) formed on the bottom surface thereof. In other words, the circuit substrate SUB is a ball grid array (BGA) circuit substrate.

Figure 3J:
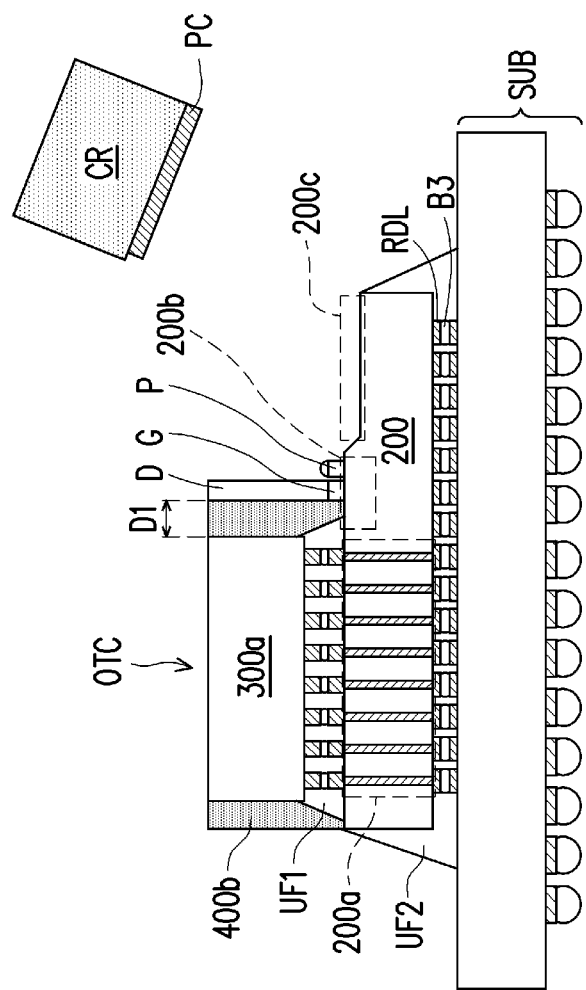

Referring to FIG. 3J, after bonding the singulated optical transceiver OTC with the circuit substrate SUB, an ablation process is performed to remove the wall structure WS embedded in the dummy die 100b such that the central region CR of the dummy die 100b and the protection coating PC are peeled from the periphery region D of the dummy die 100b and the photonic integrated circuit dies 200. In some embodiments, the ablation process is a laser ablation process for partially or entirely removing the wall structure WS. After removing the wall structure WS between the periphery region D and the central region CR of the dummy die 100b, the central region of the dummy die 100b and the protection coating PC may be picked-up and removed to such that the protrusion P and the groove 200c on the photonic integrated circuit dies 200 are revealed. The periphery region D may serve as a semiconductor dam (e.g., a silicon dam) for confining the distribution of the insulating encapsulant 400b. The semiconductor dam D is electrically floated, for example. After removing the central region CR of the dummy die 100b, a Chip-on-Wafer-on-Substrate (CoWoS) package with small form factor is accomplished. In some embodiments, the width or length of the CoWoS package with small form factor may range from about 1 centimeter to about 5 centimeters while the thickness of the CoWoS package with small form factor may range from about 1 millimeter to about 3 millimeters.

Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In some embodiments, an underfill UF2 may be formed between the singulated optical transceiver OTC and the circuit substrate SUB to laterally encapsulate the photonic integrated circuit dies 200 and the conductive bumps B3. In some alternative embodiments, the formation of the underfill UF2 may be omitted.

Figure 3K:
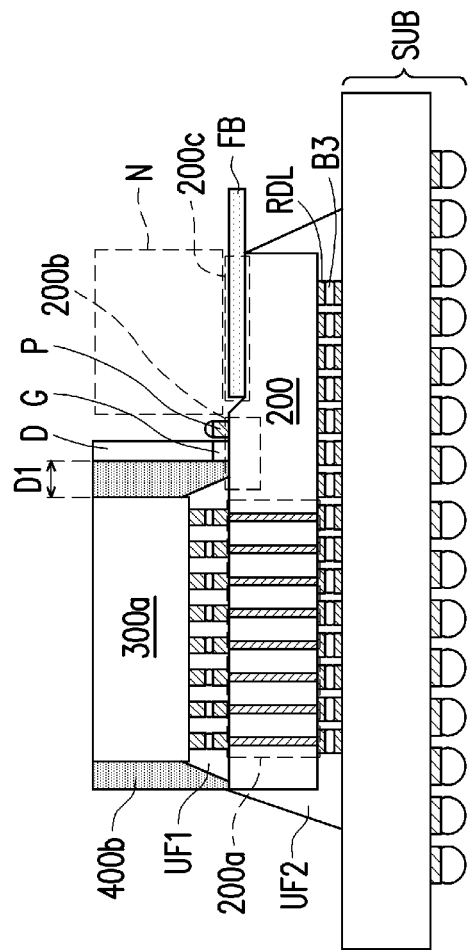

Referring to FIG. 3K, after removing the central region CR of the dummy die 100b, an optical fiber FB is provided and assembled in the groove 200c. In some embodiments, the optical fiber FB is provided and laterally inserted into the groove. The optical fiber FB extends laterally along the groove 200c and is optically coupled to the optical input/output portion 200b of the photonic integrated circuit dies 200. Since the optical fiber FB assembled in the groove 200c extends laterally, the assembly including the optical transceiver OTC and the optical fiber FB is compact.

As shown in FIG. 3K, the periphery region D (e.g. the semiconductor dam) is spaced apart from the electric integrated circuit die 300a by a distance D1. In other words, the distance D1 represents the width of a portion of the insulating encapsulant 400b between the electric integrated circuit die 300a and the periphery region D (e.g. the semiconductor dam). For example, the distance D1 ranges from about 30 micrometers to about 200 micrometers.

Figure 5:
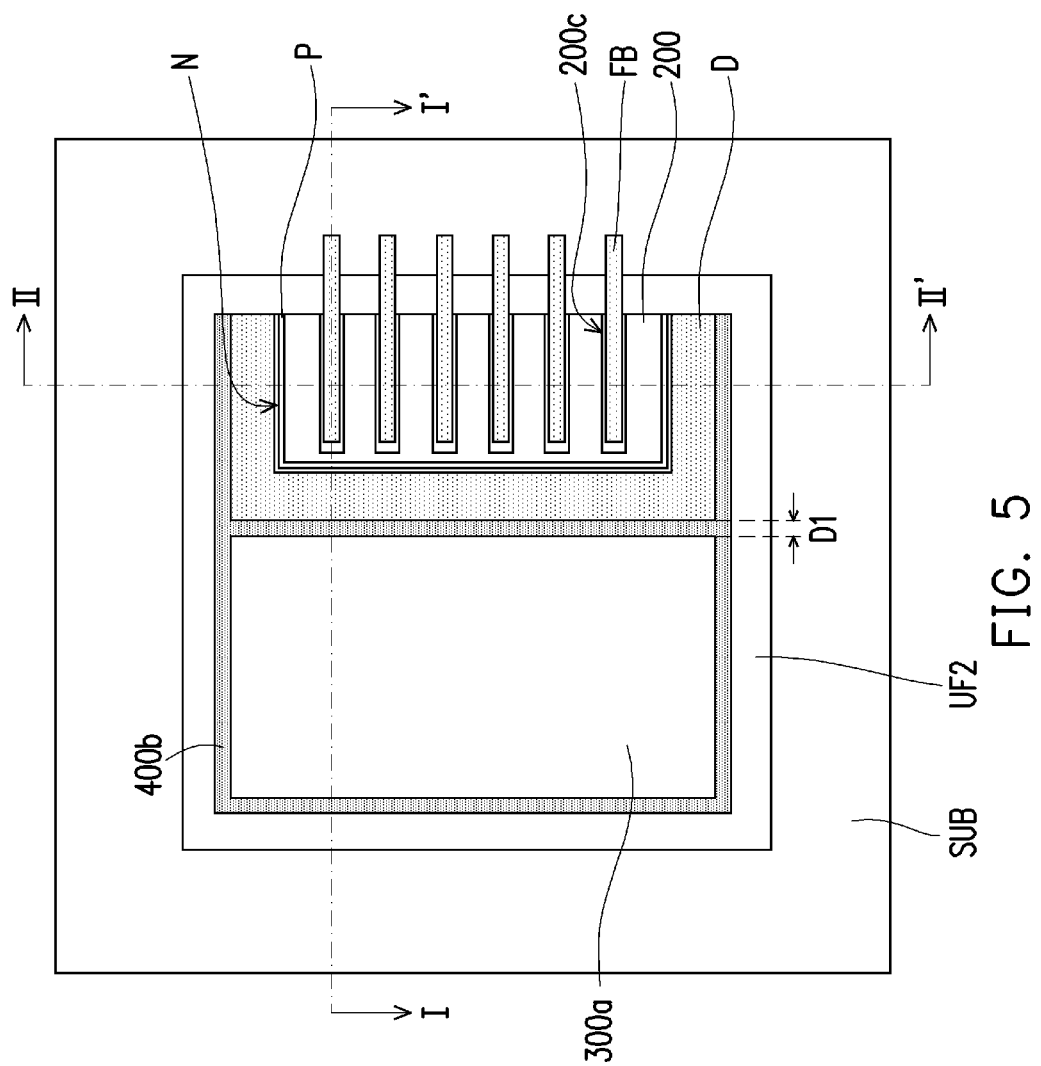
FIG. 5 schematically illustrates a top view of the CoWoS package illustrated in FIG. 3K in accordance with some embodiments of the present disclosure.
Figure 6:
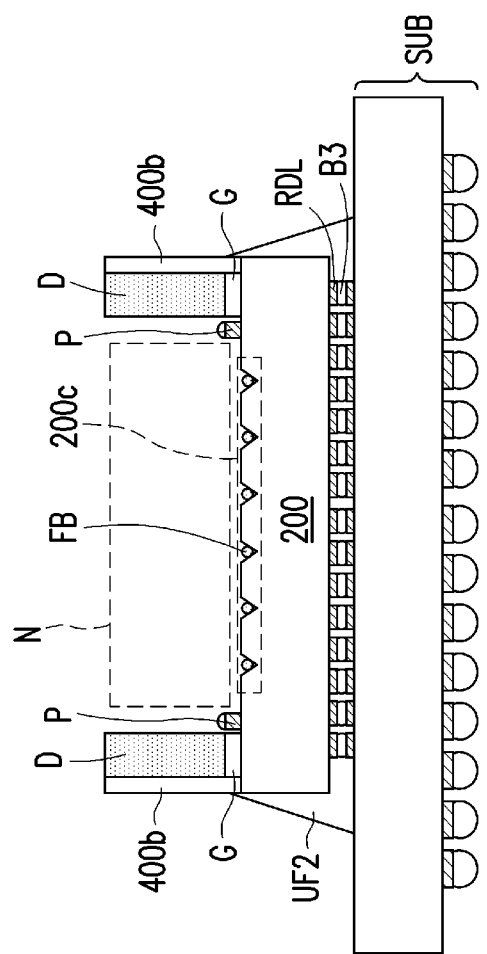
FIG. 6 schematically illustrates a cross-sectional view along the line II-IF shown in FIG. 5 in accordance with some embodiments of the present disclosure.

FIG. 4 illustrates schematically illustrates a perspective view of the interposer illustrated in FIG. 3A and the singulated dummy die illustrated in FIG. 2. In an embodiment the singulated dummy dies 100a are picked-up and placed on the first active surface AS1 of the interposer wafer INT. The singulated dummy dies 100a are attached onto the first active surface AS1 of the interposer wafer INT through the glue layers G. FIG. 5 schematically illustrates a top view of the CoWoS package in accordance with some embodiments of the present disclosure. FIG. 3K schematically illustrates a cross-sectional view along the line I-I' shown in FIG. 5 in accordance with some embodiments of the present disclosure. FIG. 6 schematically illustrates a cross-sectional view along the line II-IF shown in FIG. 5 in accordance with some embodiments of the present disclosure.

As shown in FIG. 3K, FIG. 5, and FIG. 6, after the central region CR of the dummy die 100b (shown in FIG. 3J) is removed, a notch N is formed above the photonic integrated circuit dies 200 to expose the groove 200c such that it is easier to assemble the optical fiber FB into the groove 200c. Accordingly, the yield rate of the assembly of the optical fiber FB may be increased.

Figure 7:
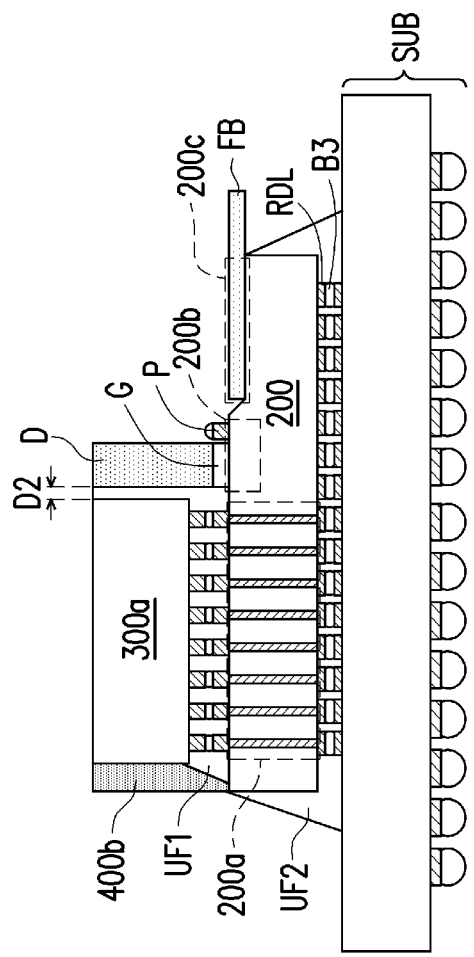
FIG. 7 and FIG. 8 schematically illustrate cross-sectional views of the CoWoS package in accordance with various embodiments of the present disclosure.
Figure 8:
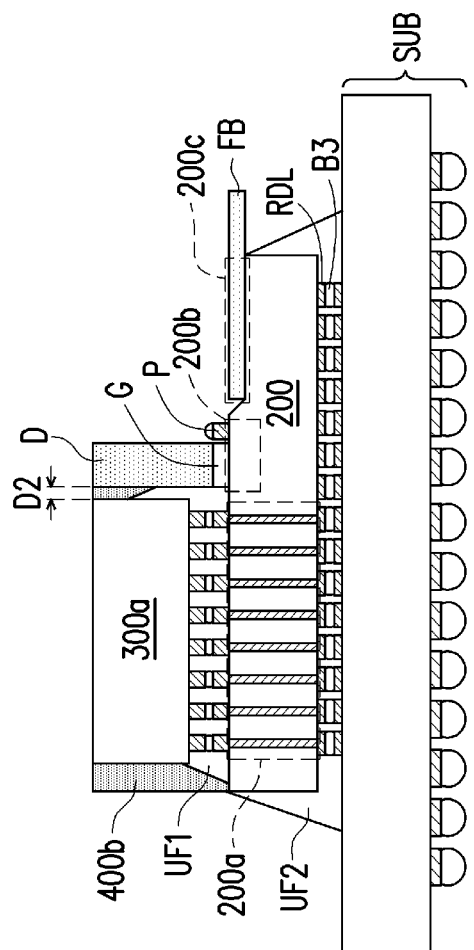

FIG. 7 and FIG. 8 schematically illustrate cross-sectional views of the CoWoS package in accordance with various embodiments of the present disclosure.

Referring to FIG. 3K and FIG. 7, the CoWoS packages illustrated in FIG. 3K and FIG. 7 are similar except that the insulating encapsulant 400b illustrated in FIG. 7 does not fill between the electric integrated circuit die 300a and the periphery region D (e.g. the semiconductor dam). Rather, the underfill UF1 is dispensed to entirely fill the space between the electric integrated circuit die 300a and the periphery region D, such as by dispensing the underfill UF1 between the periphery region D and the electric integrated circuit die 300a. As shown in FIG. 7, the periphery region D (e.g. the semiconductor dam) is spaced apart from the electric integrated circuit die 300a by a distance D2. In other words, the distance D2 represents the width of a portion of the underfill UF1 between the electric integrated circuit die 300a and the periphery region D (e.g. the semiconductor dam). For example, the distance D2 ranges from about 30 micrometers to about 200 micrometers.

Referring to FIG. 7 and FIG. 8, the CoWoS packages illustrated in FIG. 7 and FIG. 8 are similar except that the periphery region D (i.e. the semiconductor dam) illustrated in FIG. 8 is spaced apart from the electric integrated circuit die 300a by a portion of the underfill UF1 and a portion of the insulating encapsulant 400b. For example, the underfill UF1 is dispensed to fill a portion of the space between the electric integrated circuit die 300a and the periphery region D, allowing the insulating encapsulant 400b to fill a remainder of the space between the electric integrated circuit die 300a and the periphery region D. For example, the distance D2 ranges from about 30 micrometers to about 200 micrometers.

Figure 9:
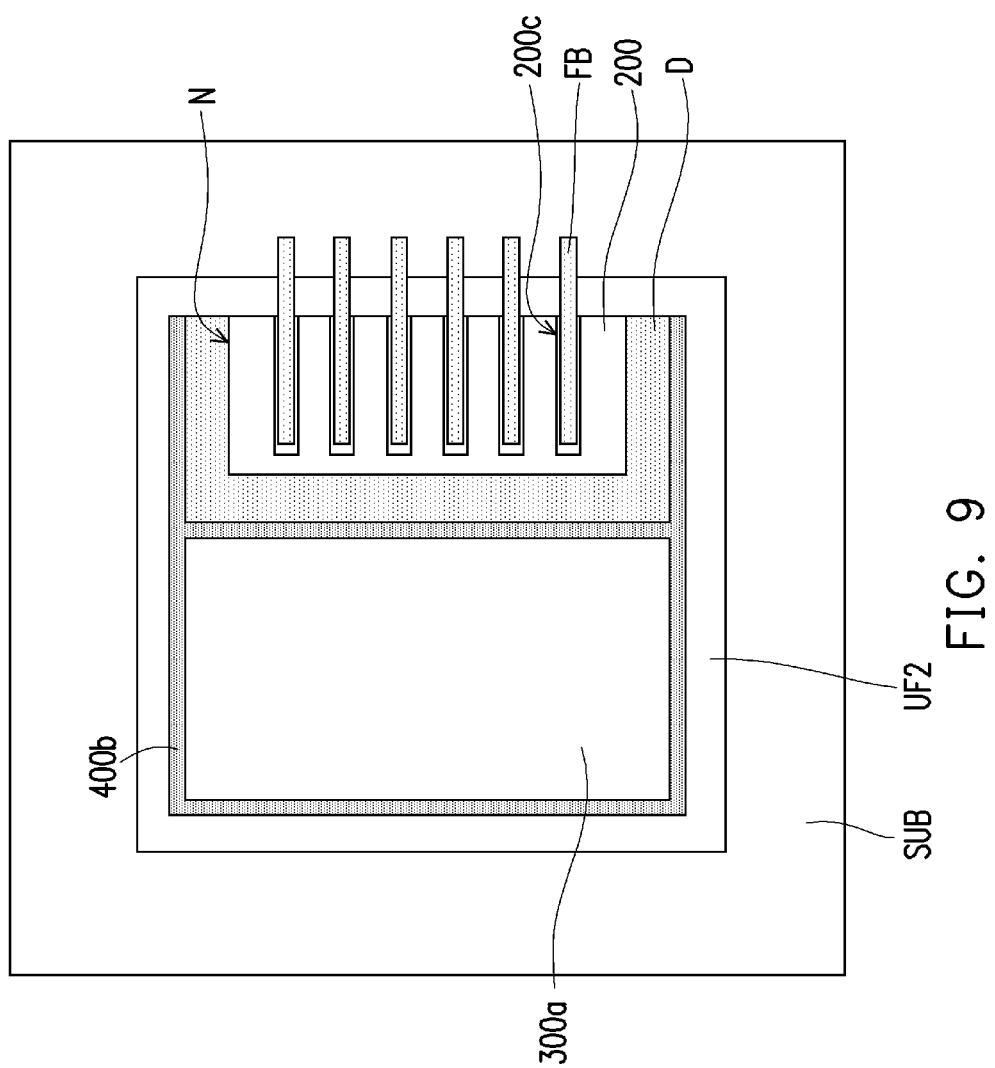
FIGS. 9 through 11 schematically illustrate top views of the CoWoS package in accordance with various embodiments of the present disclosure.
Figure 10:
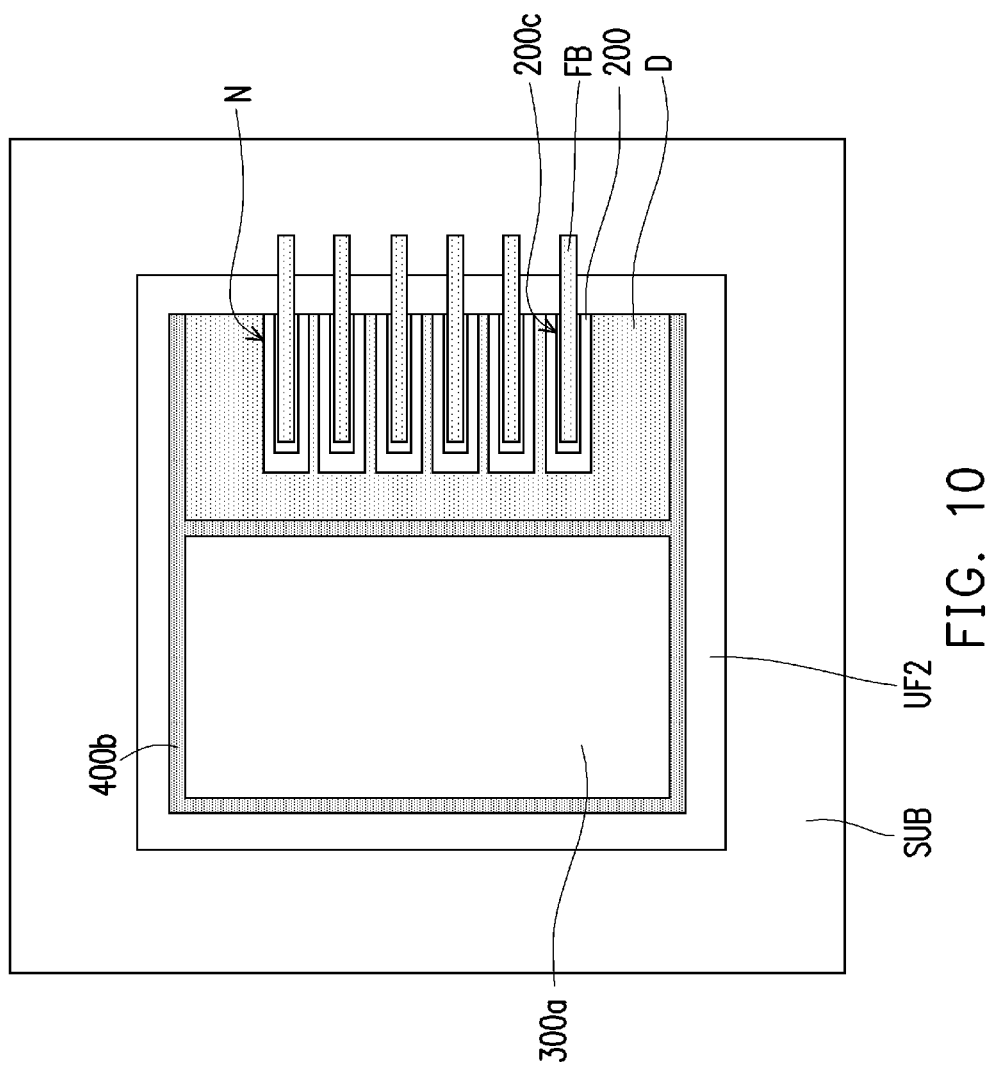
Figure 11:
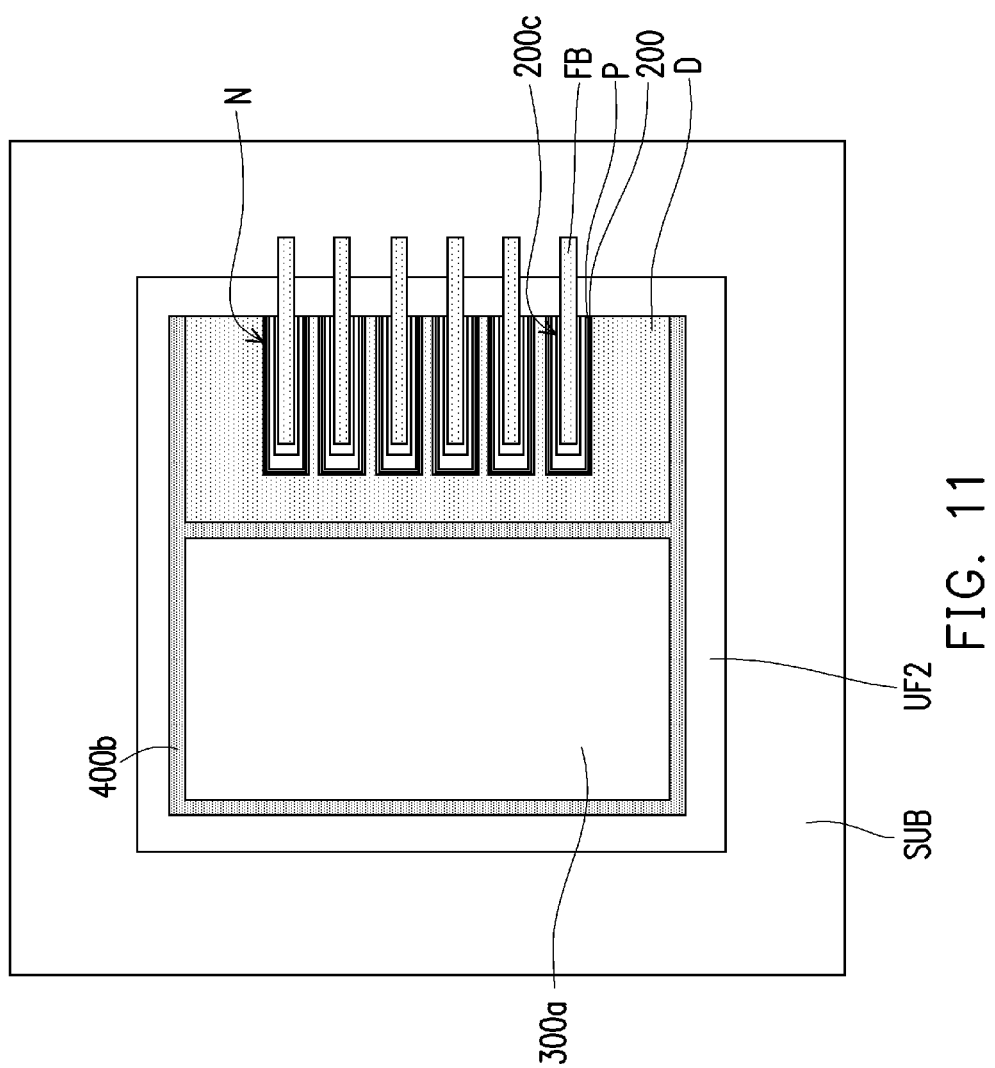

FIGS. 9 through 11 schematically illustrate top views of the CoWoS package in accordance with various embodiments of the present disclosure.

Referring to FIG. 5 and FIG. 9, the top views of the CoWoS packages illustrated in FIG. 5 and FIG. 9 are similar except that the CoWoS package illustrated in FIG. 9 does not include a protrusion P.

Referring to FIG. 9 and FIG. 10, the top views of the CoWoS packages illustrated in FIG. 9 and FIG. 10 are similar except that the semiconductor dam D of the CoWoS package illustrated in FIG. 10 is a comb-shaped semiconductor dam. As shown in FIG. 10 the comb-shaped semiconductor dam D includes a plurality of paralleled notches N. In some embodiments, the notches N expose the grooves 200c, and the extending direction of the paralleled notches N may be substantially paralleled with that of the grooves 200c.

Referring to FIG. 10 and FIG. 11, the top views of the CoWoS packages illustrated in FIG. 10 and FIG. 11 are similar except that the CoWoS package illustrated in FIG. 11 further includes a plurality of protrusions P, wherein each protrusion P is distributed corresponding to one of the notches N of the semiconductor dam D, respectively.

By utilizing the embodiments described herein, photonic fibers can be integrated within an interposer such as a silicon interposer. Further, by implementing the embodiments in a system on integrated chip (SOIC), the electrical losses can be minimized, leading to a more efficient final device.

In accordance with some embodiments of the present invention, a photonic integrated circuit die, an electric integrated circuit die, a semiconductor dam, and an insulating encapsulant is provided. The photonic integrated circuit die includes an optical input/output portion and a groove located in proximity of the optical input/output portion, wherein the groove is adapted for lateral insertion of at least one optical fiber. The electric integrated circuit die is disposed over and electrically connected to the photonic integrated circuit die. The semiconductor dam is disposed over the photonic integrated circuit die. The insulating encapsulant is disposed over the photonic integrated circuit die and laterally encapsulates the electric integrated circuit die and the semiconductor dam.

In accordance with some other embodiments of the present invention, a structure including a photonic integrated circuit die, an electric integrated circuit die, a semiconductor dam, and an insulating encapsulant is provided. The photonic integrated circuit die includes an optical input/output portion and an optical fiber insertion groove located in proximity of the optical input/output portion. The electric integrated circuit die and a semiconductor dam are disposed over the photonic integrated circuit die in a side-by-side manner, wherein the electric integrated circuit die is electrically connected to the photonic integrated circuit die. The insulating encapsulant is disposed over the photonic integrated circuit die and laterally encapsulates the electric integrated circuit die and the semiconductor dam, wherein a side surface of the semiconductor dam is accessibly exposed from the insulating encapsulation, and the semiconductor dam separates the optical fiber insertion groove from the insulating encapsulant.

In accordance with some alternative embodiments of the present invention, a method including the following steps is provided. A photonic integrated circuit die including at least one optical input/output portion and at least one groove located in proximity of the optical input/output portion is provided. An electric integrated circuit die and a dummy die are bonded onto the photonic integrated circuit die. A portion of the dummy die is removed to form a semiconductor dam having a notch such that the at least one groove is exposed by the notch of the semiconductor dam.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a photonic integrated circuit die comprising an optical input/output portion and a groove located adjacent to the optical input/output portion;
   an electric integrated circuit die disposed over and electrically connected to the photonic integrated circuit die;
   a semiconductor dam disposed over the photonic integrated circuit die, wherein the semiconductor dam comprises a notch, and the groove is accessibly exposed by the notch of the semiconductor dam; and
   an insulating encapsulant disposed over the photonic integrated circuit die, laterally encapsulating the electric integrated circuit die, and in physical contact with the semiconductor dam.

2. The structure as claimed in claim 1, wherein the electric integrated circuit die is electrically connected to the photonic integrated circuit die through a plurality of microbumps.

3. The structure as claimed in claim 1 further comprising:
   a protrusion disposed over the photonic integrated circuit die, wherein the protrusion is accessibly exposed by the notch of the semiconductor dam.

4. The structure as claimed in claim 1 further comprising:
   a glue layer between the semiconductor dam and the photonic integrated circuit die.

5. The structure as claimed in claim 1, further comprising at least one optical fiber located within the groove.

6. The structure as claimed in claim 1 further comprising:
   a circuit substrate, wherein the photonic integrated circuit die is disposed over and electrically connected to the circuit substrate.

7. The structure as claimed in claim 6, further comprising:
   a plurality of conductive bumps; and
   an underfill disposed between the circuit substrate and the photonic integrated circuit die, wherein the photonic integrated circuit die is electrically connected to the circuit substrate through the conductive bumps, and the conductive bumps are encapsulated by the underfill.

8. A structure comprising:
   a photonic integrated circuit die comprising an optical input/output portion and an optical fiber groove adjacent to the optical input/output portion;
   an electric integrated circuit die and a semiconductor dam disposed over the photonic integrated circuit die in a side-by-side manner, the electric integrated circuit die being electrically connected to the photonic integrated circuit die;
   an insulating encapsulant disposed over the photonic integrated circuit die, laterally encapsulating the electric integrated circuit die, and being in physical contact with multiple sides of the semiconductor dam, wherein a side surface of the semiconductor dam is accessibly exposed from the insulating encapsulation, and the semiconductor dam separates the optical fiber groove from the insulating encapsulant; and
   at least one optical fiber located within the optical fiber groove.

9. The structure as claimed in claim 8, wherein the semiconductor dam comprises a notch, the optical fiber groove is accessibly exposed by the notch of the semiconductor dam, and the insulating encapsulant is not located in the notch of the semiconductor dam.

10. The structure as claimed in claim 9 further comprising:
    a protrusion disposed over the photonic integrated circuit die, wherein the protrusion is accessibly exposed by the notch of the semiconductor dam.

11. The structure as claimed in claim 9, wherein a top surface of the electric integrated circuit die is level with a top surface of the semiconductor dam.

12. The structure as claimed in claim 8 further comprising:
    a circuit substrate, wherein the photonic integrated circuit die is disposed over and electrically connected to the circuit substrate.

13. The structure as claimed in claim 12 further comprising:
    a plurality of conductive bumps; and
    an underfill disposed between the circuit substrate and the photonic integrated circuit die, wherein the photonic integrated circuit die is electrically connected to the circuit substrate through the conductive bumps, the conductive bumps are encapsulated by the underfill.

14. The structure as claimed in claim 13, wherein the underfill entirely fills a space between the electric integrated circuit die and the semiconductor dam.

15. The structure as claimed in claim 13, wherein the underfill and the insulating encapsulant entirely fills a space between the electric integrated circuit die and the semiconductor dam.

16. A method, comprising:
    providing a photonic integrated circuit die comprising at least one optical input/output portion and at least one groove;
    bonding an electric integrated circuit die and a dummy die onto the photonic integrated circuit die; and
    removing a portion of the dummy die to form a semiconductor dam having a notch such that the at least one groove is exposed by the notch of the semiconductor dam.

17. The method as claimed in claim 16 further comprising:
    assembling at least one optical fiber in the at least one groove.

18. The method as claimed in claim 16 further comprising:
    prior to removing the portion of the dummy die, mounting the photonic integrated circuit die having the electric integrated circuit die and the dummy die bonded thereon over a circuit substrate.

19. The method as claimed in claim 16 further comprising:
prior to removing the portion of the dummy die, laterally encapsulating the electric integrated circuit die and the dummy die bonded on the photonic integrated circuit die.

20. The method as claimed in claim 16, wherein a protrusion is disposed over the photonic integrated circuit die, and the protrusion is accessibly exposed by the notch of the semiconductor dam.

* * * * *